(12) United States Patent
Chen et al.

(10) Patent No.: US 6,553,088 B1
(45) Date of Patent: Apr. 22, 2003

(54) DIGITAL DELAY PHASE LOCKED LOOP

(75) Inventors: Juei-Lung Chen, Hsinchu (TW); Shih-Huang Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 102 days.

(21) Appl. No.: 09/734,626

(22) Filed: Dec. 11, 2000

(30) Foreign Application Priority Data

Dec. 4, 2000 (TW) .................................... 89221041 U

(51) Int. Cl.[7] ................................................ H03D 3/24

(52) U.S. Cl. ...................................... 375/376; 327/161

(58) Field of Search ................................ 375/373, 376, 375/327; 327/156, 158, 161, 159

(56) References Cited

U.S. PATENT DOCUMENTS

| 6,087,868 A | * | 7/2000 | Millar | 327/156 |
| 6,150,859 A | * | 11/2000 | Park | 327/158 |
| 6,359,482 B1 | * | 3/2002 | Miller, Jr. et al. | 327/156 |

* cited by examiner

Primary Examiner—Temesghen Ghebretinsae

(57) ABSTRACT

A digital delay phase locked loop, to quickly perform the phase lock on an input clock signal. The digital delay phase locked circuit has a delay apparatus, a buffer, a phase comparator, an adder-register, a clock divider and a demultiplexer. After a delay operation performed on the input clock signal by the delay apparatus, the phase locked clock signal is output via the buffer. The above two signals are then compared with each other using the phase comparator to output a comparison signal to the adder-register for addition/subtraction delay. Being controlled by the clock divider, the objective of fast phase lock is achieved by the addition/subtraction operation of the demultiplexer.

7 Claims, 5 Drawing Sheets

DIGITAL DELAY PHASE LOCKED LOOP

CROSS-REFERENCE TO RELATED APPLICATION

This application claims the priority benefit of Taiwan application serial no. 89221041, filed Dec. 4, 2000.

BACKGROUND OF THE INVENTION

1. Field of the Invention

The invention relates in general to a delay phase locked loop. More particularly, the invention relates to a digital delay phase locked loop using binary control to achieve a fast phase lock effect.

2. Description of the Related Art

FIG. 1 shows a circuit diagram of a conventional digital delay phase locked loop. A clock signal CLK is input to a buffer 10 which is constructed by several unit delays (UD) to perform a delay operation. The clock signal is then sent to a buffer 12, and a phase locked clock signal DCLK is output thereby. A phase comparator 14 is also included to compare the input clock signal CLK and the phase locked signal DCLK. A comparison signal according to the difference in periods of these two signals CLK and DCLK is generated and output. For example, as shown in FIG. 1, either of the UP and DOWN is used to perform an advance or delay modification of the difference to achieve the objective of phase lock.

FIGS. 2 and 3 show the waveforms of the above signals. In FIG. 2, the difference in periods between the clock signal CLK and the phase locked signal DCLK is Td. The comparison signal UP output by the phase comparator 14 as shown in FIG. 1 gradually decreases the period difference Td between the signals DCLK and CLK under the influence of the delay apparatus 10. As shown in FIG. 2, period difference Td is gradually decreased to Td−(1*Tud), Td−(2*Tud) and Td−(3*Tud).

Similarly, from the comparison signal DOWN output by the phase comparator 14, it is clear that Td is far larger than one cycle, and the rising point of the phase locked signal DCLK is located at a low voltage of the clock signal CLK. Therefore, the phase comparator 14 outputs the comparison signal DOWN to have the signal DCLK reduce from Td to Tm+(1*Tud), Td+(2*Tud) and Td+(3*Tud) to reduce the period difference.

In the above delay apparatus, shift registers are used as the controller for the unit delays. Only one unit is shifted once. When the Td is large, a very long time is required to complete the phase lock. When the bandwidth becomes magnificent, the number of unit delays has to be increased. It is thus difficult to meet the current requirements in industry.

SUMMARY OF THE INVENTION

The invention provides a digital delay phase locked loop. A phase comparing converter is designed to convert the time differenct between a phase locked data signal and an input data signal to a digital output comparison signal. The comparison signal is sent to an adder-register with multiple bits. Using a demultiplexer, the delay function of the delay apparatus is controlled to quickly perform the phase lock.

The digital delay phase locked is applicable to receive an input clock signal. After a fast phase lock, a phase locked clock signal is output. The above digital delay phase locked loop comprises a delay apparatus, a buffer, a phase comparing converter, an adder-register, a clock divider and a demultiplexer.

The delay apparatus performs a delay function while receives an input clock signal, and then outputs a delay data signal. After receiving the delay clock signal, the buffer outputs a phase locked signal. The time difference of the phase locked data signal is comapred to that of the input data signal, a comparison signal converted into digits is then output. The adder-register receives and temporary stores the comparison signal. After receiving the clock signal, the clock divider outputs a data refresh signal to the adder-register. A modified signal is then output by the adder-register. The modified signal is received by the demultiplexer, and a control signal is output from the demultiplexer to the delay apparatus to control the delay function, so as to achieve the phase lock function.

The above delay apparatus comprises several unit delays connected to each other in series. The demultiplexer comprises several control gates connected in parallel. Each control gate is corresponding to one unit delay. The control gate comprises and an AND gate or an NAND. The adder-register comprises a multiple bit register to control the generation of several unit delays at once, so as to achieve the fast phase lock effect.

Both the foregoing general description and the following detailed description are exemplary and explanatory only and are not restrictive of the invention, as claimed.

DESCRIPTION OF THE PREFERRED EMBODIMENTS

Figure 1:
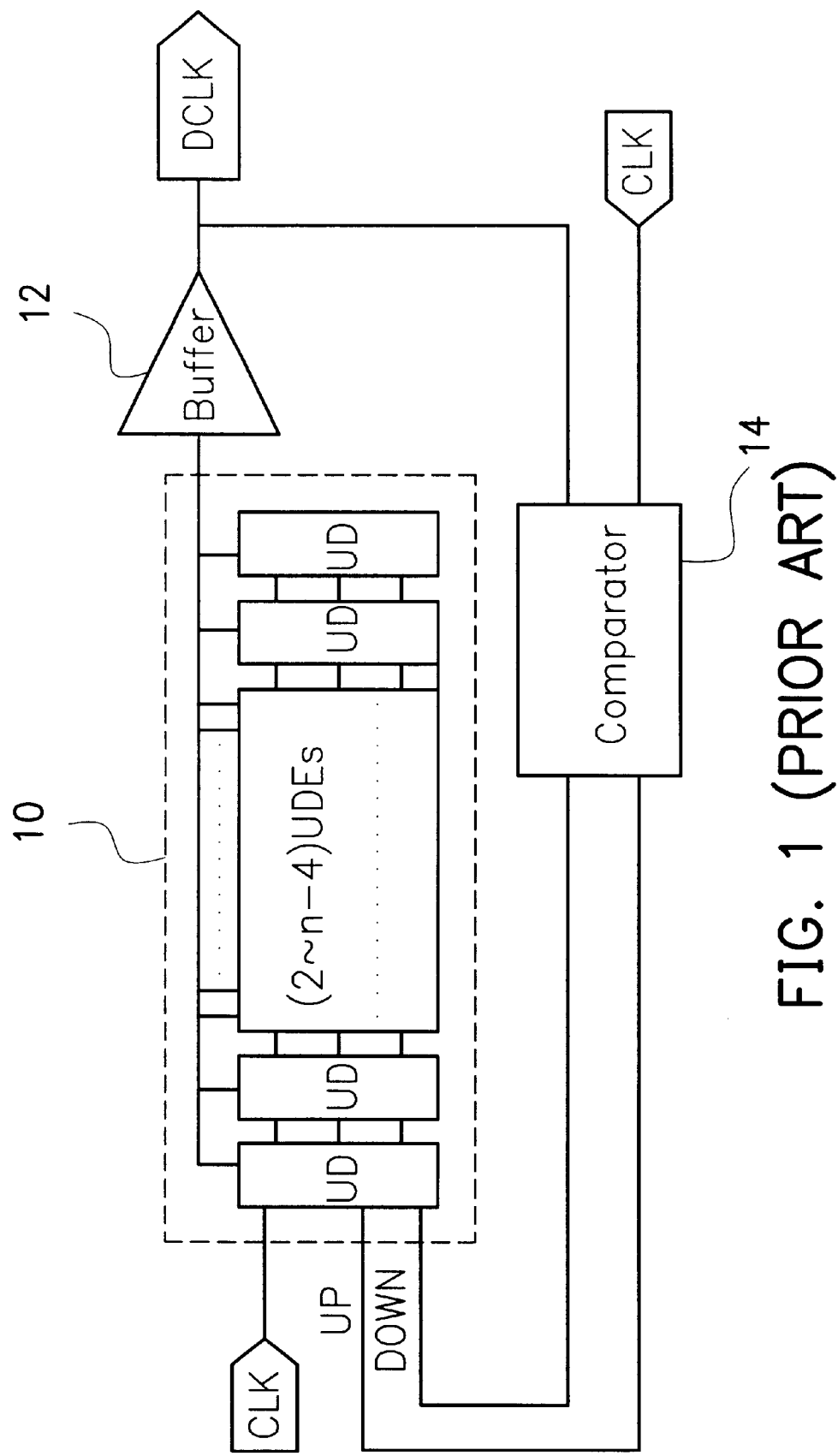
FIG. 1 shows a circuit diagram of a conventional digital delay phase locked circuit.
Figure 2:
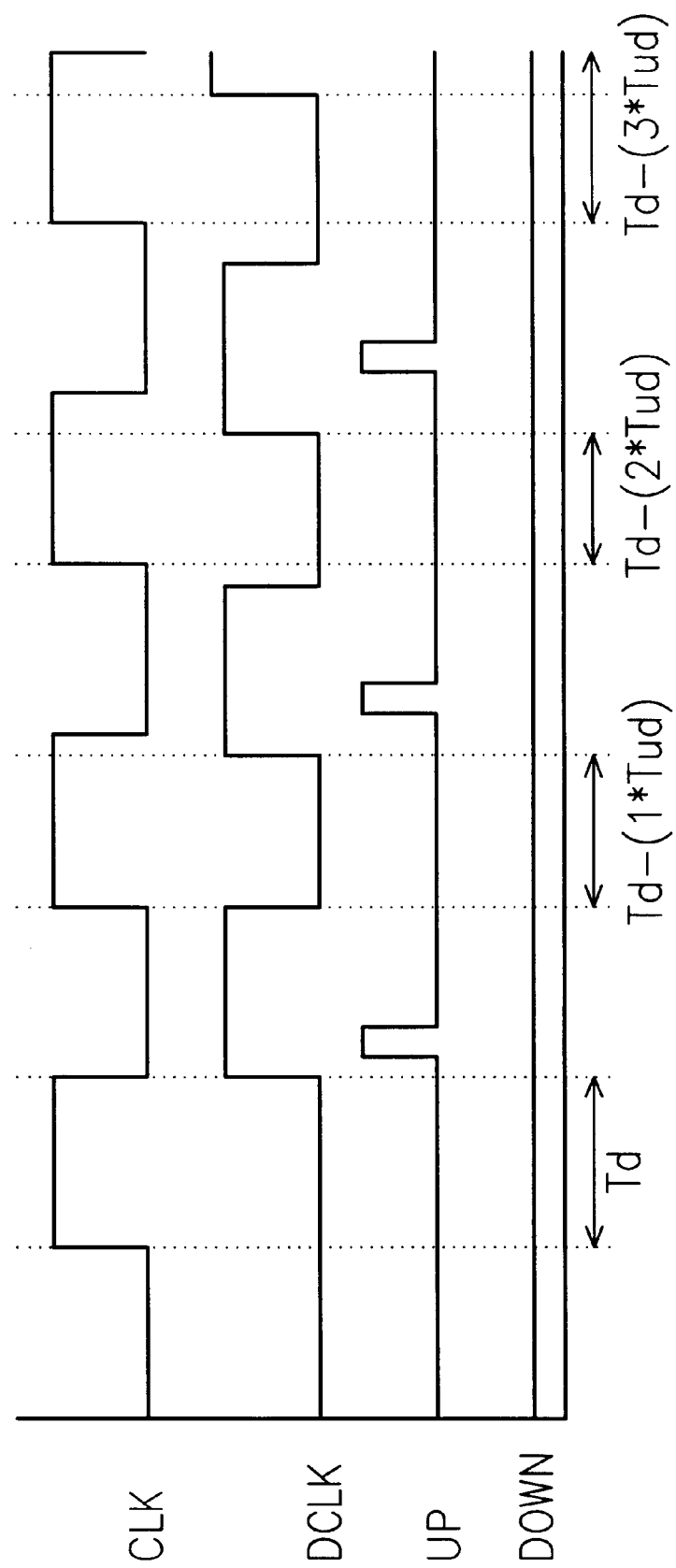
FIG. 2 shows a waveform of an UP signal in FIG. 1.
Figure 3:
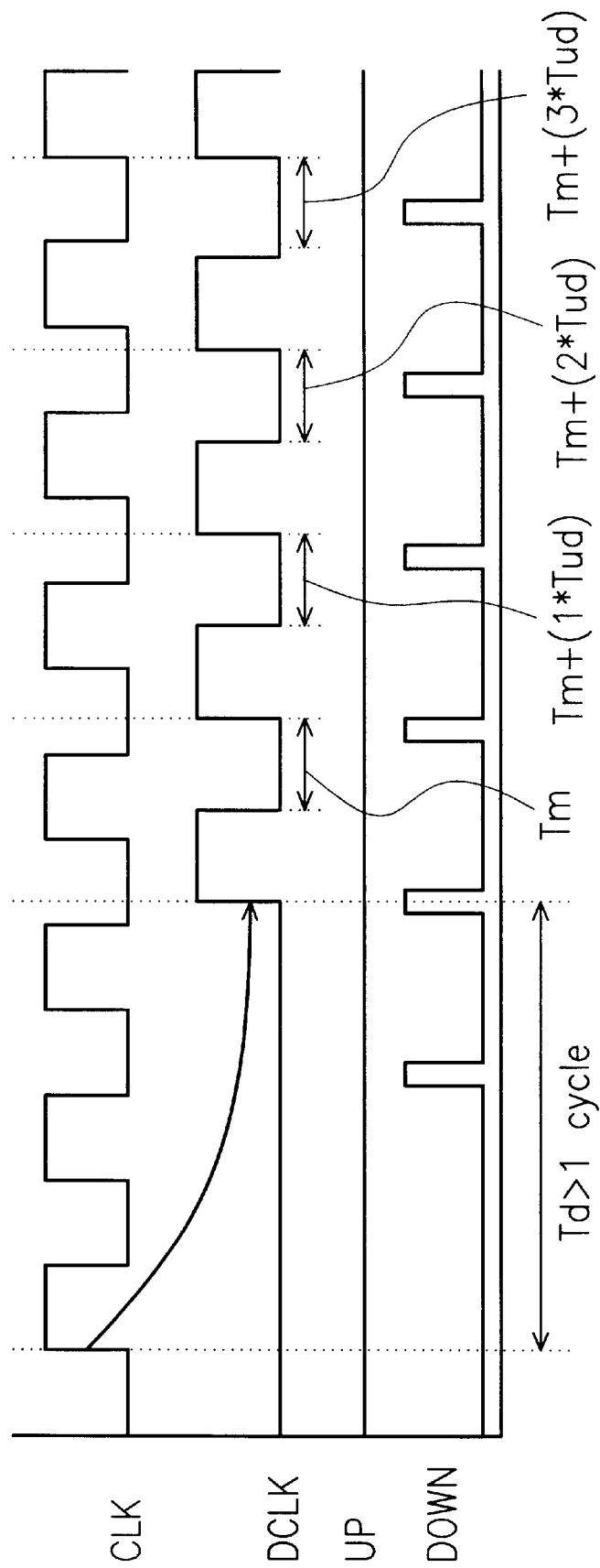
FIG. 3 shows a waveform of an UP signal in FIG. 1.
Figure 4:
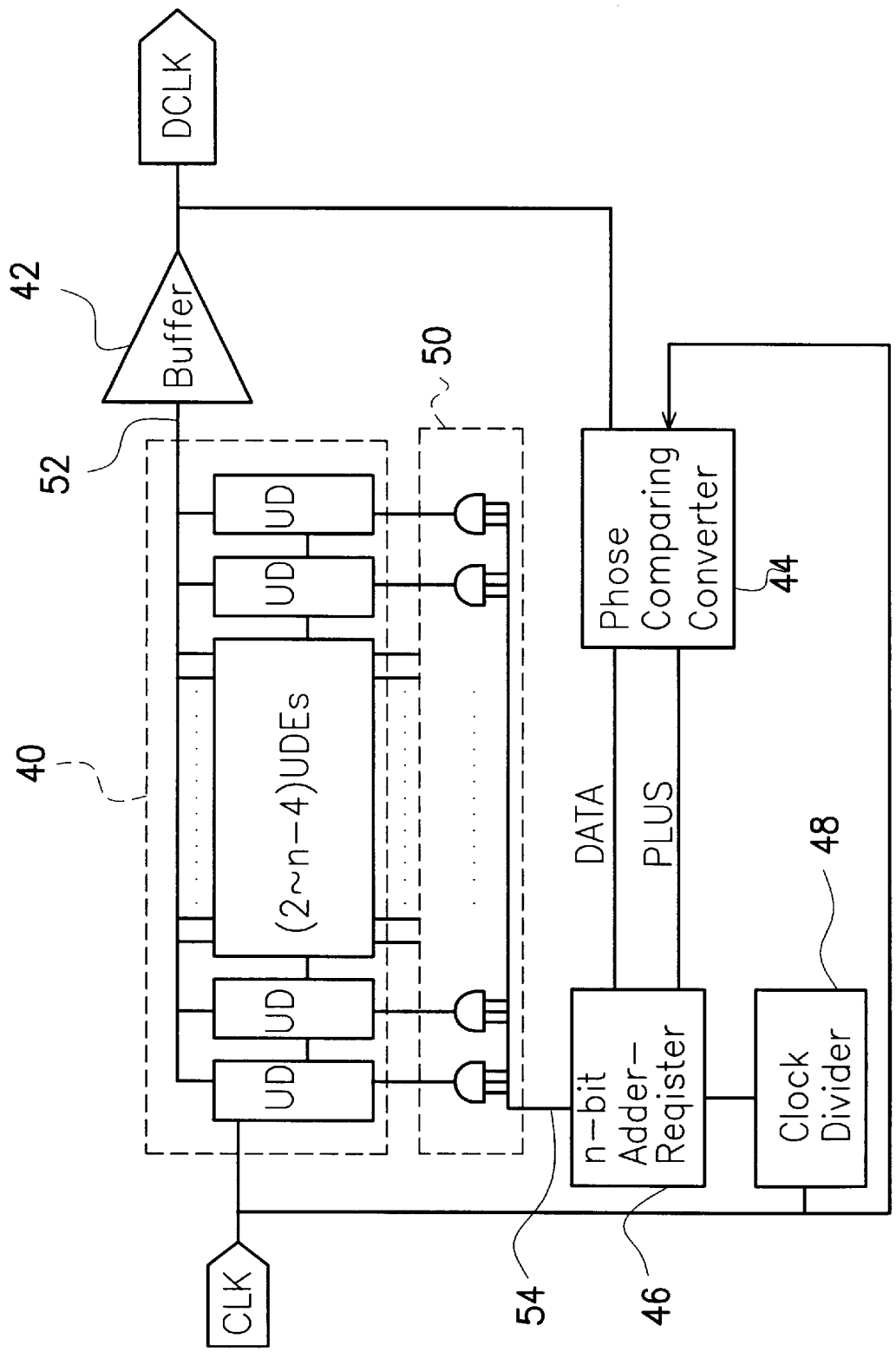
FIG. 4 shows a circuit diagram of a digital phase locked loop according to the invention.

FIG. 4 shows a preferred embodiment of a digital delay phase locked loop according to the invention.

As shown in FIG. 4, the digital delay phase locked loop comprises a delay apparatus 40, a buffer 42, a phase comparing converter 44, an adder-register 46, a clock divider 48 and a demultiplexer 50.

A clock signal CLK is received by a delay apparatus 40 and delayed thereby. The structure of the delay apparatus 40 comprises a plurality of unit delays connected in series. A delay data signal is output to a buffer 42 which then outputs a phase locked clock signal DCLK. Meanwhile, the phase comparing converter 44 also receives the phase locked clock signal DCLK and the clock signal CLK from the buffer 42. The times of the phase locked clock DCLK signal and the clock signal CLK are compared to each other. According to the time difference, comparison signals (DATA and PLUS as shown in FIG. 4) output in digits is generated and used to perform multiple delay functions at once to achieve the fast phase lock. As the adder-register 46 is used for temporary storage, and accompanied with the clock divider 48, a data refresh signal UPD is output to the adder-register 46 after receiving the clock signal CLK. A modified signal 54 is thus output from the adder-register 46 to the demultiplexer 50. The demultiplexer 50 has a structure of a plurality of control gates connected in parallel. Each control gate is connected to one unit delay. The control gates comprise AND gates or NAND gates. The modified signal 54 output from the adder-register 46 to the demultiplexer 50 enables the control gates to function simultaneously. Therefore, more than one unit delays can be operated at the same time, so that the delay function can be achieved in a short time to achieve the objective of fast phase lock.

Figure 5:
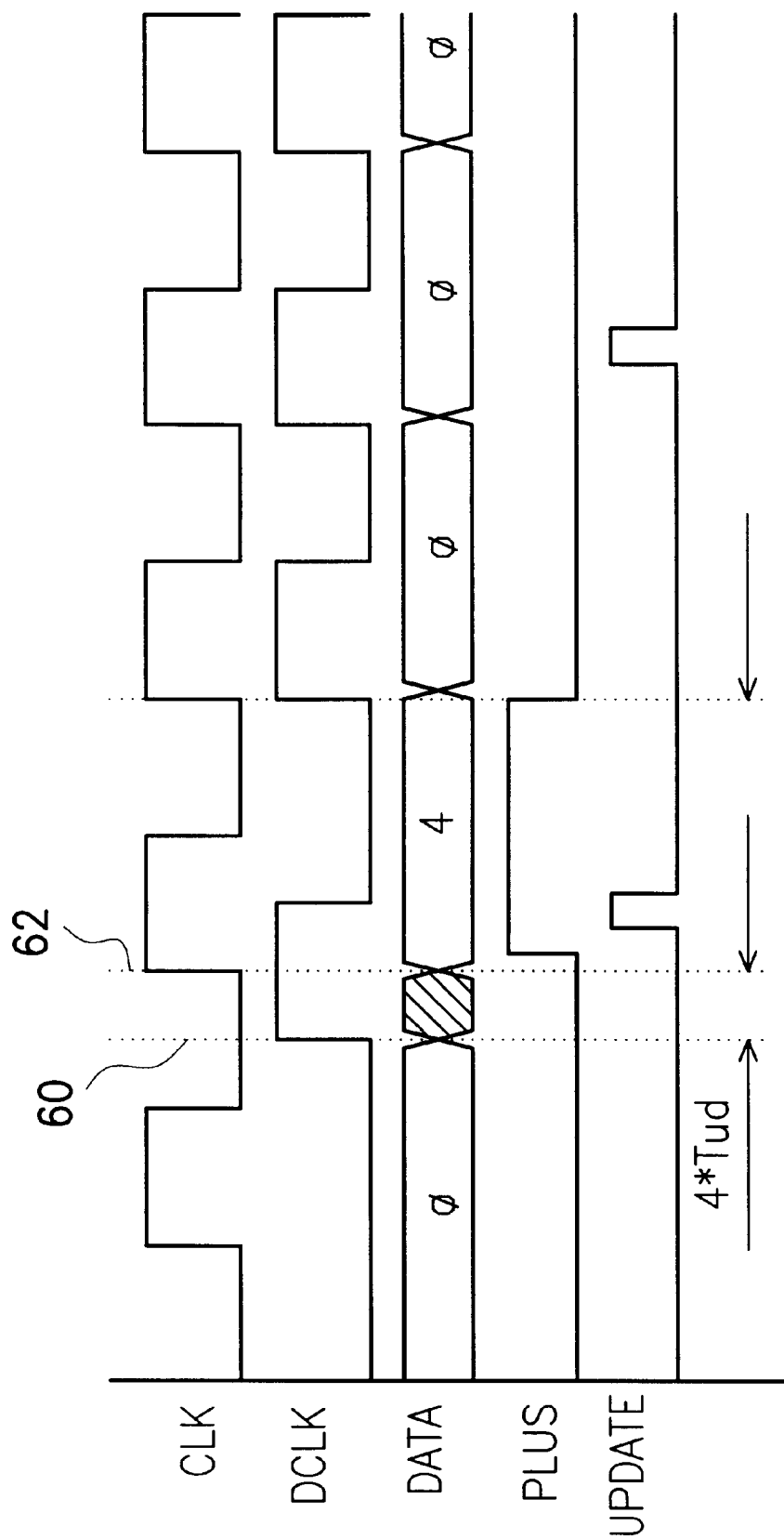
FIG. 5 shows the waveform of an UP signal in FIG. 4.

A further description of the waveforms of signals in the digital delay phase locked circuit is given as follows. When the clock signal CLK is input, and is transferred through the delay apparatus 40 and the buffer 42, the generated phase locked clock signal DCLK generates a delay of about one periodic wave (under the normal condition) as the generation time difference between the signals CLK and DCLK. The time difference between the signals CLK and DCLK illustrated as the distance between the dash lines 60 and 62, that is, the hatch portion of DATA in FIG. 5, is compared by the phase comparing converter 44. The time difference is then converted into a comparison signal in a form of digits to be output. For example, assuming that the delay time generated of the unit delay in the delay apparatus 40 is Tud, a time of 4*Tud can be obtained from FIG. 5. According to the modified signal 54 output from the adder-register 46, that is, the signal PLUS as shown in FIG. 5, the delay time of the phase locked clock signal DCLK is controlled. Plus the UPD (the UPDATE in FIG. 5) generated by the clock divider, the phase clock can be performed quickly.

According to the above, the digital delay phase locked loop provided by the invention uses a phase comparing converter to convert the time difference into a comparison signal in a form of digits. Assisted with the adder-register with multiple bits to control the demultiplexer, more than one delay functions can be performed at the same time to achieve the phase lock.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A digital delay phase locked loop, used to receive a clock signal and perform a phase lock to output a phase locked clock signal, the digital delay phase locked loop comprising:

a delay apparatus, to receive the clock signal to perform a phase lock, and to output a delay data signal;

a buffer, to receive the delay data signal and to output the phase locked clock signal;

a phase comparing converter, to receive and to obtain a time difference between the clock signal and the phase locked clock signal, and to convert the time difference into a comparison signal in digits for output;

an adder-register, to receive and temporary store the comparison signal;

a clock divider, to receive the clock signal and to output a data refresh signal to the adder-register, so that a modified signal is output by the adder-register; and a demultiplexer, to receive the modified signal and to output a control signal to the delay apparatus to control the delay function to achieve phase lock.

2. The digital delay phase locked loop according to claim 1, wherein the delay apparatus comprises a plurality of unit delay connected in series.

3. The digital delay phase locked loop according to claim 1, wherein the demultiplexer comprises a plurality of control gates.

4. The digital delay phase locked loop according to claim 3, wherein the control gates comprise a plurality of AND gates.

5. The digital delay phase locked loop according to claim 3, wherein the control gates comprise a plurality of NAND gates.

6. The digital delay phase locked loop according to claim 1, wherein the adder-register comprises a register with multiple bits to control a plurality of the unit delays at the same time.

7. A digital delay phase locked loop, comprising:

a delay apparatus, comprising a plurality of unit delays connected in series, to receive a clock signal for performing delay function, and to output a delay data signal;

a buffer, output a phase locked clock signal after receiving the delay data signal;

a phase comparing converter, to receiving and compare a time difference between the clock signal and the phase locked clock signal, and to convert the time difference into a digital comparison signal to be output;

an adder-register, to receive and temporarily store the comparison signal;

a clock divider, to output a data refresh signal to the adder-register after receiving the clock signal, so that the adder-register can output a modified signal; and a demultiplexer, comprising a plurality of control gates connected in parallel, each control gate being connected to one of the unit delays to receive the modified signal, and to output a control signal to the unit delay to control the delay function for phase lock.

* * * * *